United States Patent
Rao et al.

(10) Patent No.: US 9,254,633 B2
(45) Date of Patent: Feb. 9, 2016

(54) ENVIRONMENTAL SEAL MAXIMIZING SENSOR SPACE BENEATH A BUTTON POSITIONED IN TRIM

(71) Applicant: Apple Inc., Cupertino, CA (US)

(72) Inventors: Matthew P. Rao, San Francisco, CA (US); Scott A. Myers, Palo Alto, CA (US); James R. Kroghdahl, Cupertino, CA (US); Alex M. Lee, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 157 days.

(21) Appl. No.: 13/937,776

(22) Filed: Jul. 9, 2013

(65) Prior Publication Data

US 2015/0014141 A1    Jan. 15, 2015

(51) Int. Cl.
*H01H 13/06* (2006.01)
*H01H 13/86* (2006.01)
*B32B 37/12* (2006.01)
*G06K 9/00* (2006.01)

(52) U.S. Cl.
CPC .......... *B32B 37/1284* (2013.01); *G06K 9/0002* (2013.01); *G06K 9/00053* (2013.01); *G06K 9/00919* (2013.01); *H03K 2217/960755* (2013.01); *H03K 2217/960765* (2013.01)

(58) Field of Classification Search
CPC .... H01H 13/86; H01H 2223/002; H01H 9/04
USPC .......................................... 200/302.1, 302.2
See application file for complete search history.

(56) References Cited

U.S. PATENT DOCUMENTS

| | | | | |
|---|---|---|---|---|
| 2002/0063109 A1* | 5/2002 | Hayashizaki | ...... | H01H 13/7006 216/28 |
| 2008/0264700 A1* | 10/2008 | Yoon | ...... | G06F 1/1616 178/18.03 |
| 2012/0039038 A1* | 2/2012 | Song | ...... | G06F 1/1616 361/679.55 |
| 2014/0071596 A1* | 3/2014 | Shukla | ...... | H05K 5/0017 361/679.01 |

* cited by examiner

*Primary Examiner* — Renee Luebke
*Assistant Examiner* — Ahmed Saeed
(74) *Attorney, Agent, or Firm* — Brownstein Hyatt Farber Schreck, LLP (57) ABSTRACT

An environmental seal is formed around a square sensor disposed beneath a circular button cap within a button assembly. The button assembly includes shelf portions each extending separately into the interior of the assembly from a sidewall of the assembly. Portions of the sidewall are exposed between the shelf portions large enough to permit the four corners of the square sensor to contact the sidewall. The button cap is set above the sensor, resting upon the shelf portions. A first sealant bonds the top faces of the shelf portions to the bottom of the button cap. A second sealant bonds the edges of the sidewall to the corners of the sensor. The second sealant interfaces with the first sealant to form a complete environmental seal.

15 Claims, 9 Drawing Sheets

ENVIRONMENTAL SEAL MAXIMIZING SENSOR SPACE BENEATH A BUTTON POSITIONED IN TRIM

TECHNICAL FIELD

This disclosure generally relates to an environmental seal for a button assembly containing a sensor.

BACKGROUND

Portable electronic devices are becoming increasingly popular. Examples of such devices include cell phones and tablet computers. These devices may be subjected to a number of different environments as the user transports them from place to place, increasing exposure to dust, lint, moisture and other foreign matter that can enter apertures of a device housing and interfere with device operation. Accordingly, many portable electronic devices are manufactured with a number of environmental seals which prevent or impede the ingress of foreign matter.

In order to add additional buttons, sensors, or other components to an electronic device, additional environmental seals may be used. However, portable electronic devices are also generally small in size, so the space for both components and seals is limited.

Accordingly, there may be a present need for an environmental seal that effectively prevents ingress of foreign matter while maximizing available space within a sealed interior volume of a portable electronic device.

SUMMARY

This application discloses techniques for forming an environmental seal around a sensor disposed beneath a button cap. In certain embodiments, the sensor may be a fingerprint sensor which can receive information with respect to fingerprint images, and which can be incorporated into devices using fingerprint recognition. For example, the fingerprint sensor can be disposed beneath a control button or display element for fingerprint recognition and authentication while the device is being operated by a user.

Embodiments described herein may relate to or take the form of a sealed volume with a first and second shelf portion extending separately into the interior of the volume from a sidewall of the volume so as to expose at least a first portion of sidewall between the first and second shelf portions. In addition, a first adhesive of one type can be applied to a top face of the first shelf portion, and a second adhesive of the same type can be applied to a top face of the second shelf portion. A cap can be positioned to extend across the interior volume to adhere to both the first adhesive and the second adhesive. A third adhesive of a second type can be applied to adhere the edge of the cap to the at least a first portion of exposed interior sidewall.

In further embodiments, the first adhesive type may be a heat activated film, and the second adhesive type may be a liquid adhesive.

In further embodiments, the two adhesive types may be cured in the same process, or in alternate embodiments, the adhesives may be cured in different processes.

Other embodiments described herein may relate to or take the form of a button assembly with a first and a second shelf portion that may extend separately into the interior of the assembly from a sidewall of the assembly so as to expose at least a first portion of sidewall between the first and second shelf portions. A cap may be positioned to extend across the assembly to rest on top of both the first and second shelf portions. A sensor may be positioned below the cap such that at least a first portion of the sensor extends to meet the at least a first portion of sidewall, and at least a second portion of the sensor extends toward the edges of the first and second shelf portions. Below the sensor, a switch portion may be positioned.

In further embodiments, the button assembly may be circular and the sensor may be square. In some cases, a square sensor may have each corner meet a portion of the sidewall of the circular assembly.

Other embodiments described herein may relate to or take the form of a method of sealing a volume. An assembly may be selected to have an interior volume including at least a first and second shelf portion extending separately into the interior of the volume from a sidewall of the volume so as to expose at least a first portion of sidewall between the first and second shelf portions. A first adhesive of a first adhesive type may be applied to a top face of the first shelf portion, and a second adhesive of the first adhesive type may be applied to a top face of the second shelf portion. A cap may be positioned to extend to adhere to both the first adhesive and the second adhesive. Finally, a third adhesive of a second adhesive type may be applied to adhere the cap to the at least a first portion of exposed interior sidewall.

In further embodiments, the selected assembly may be cylindrical or circular.

In further embodiments, the first adhesive type may be a heat activated film and the second adhesive type may be a liquid adhesive. These two adhesive types may be cured in the same process or in different processes. In some embodiments, the second adhesive may be jet injected.

Other embodiments described herein may relate to or take the form of a method of sealing a volume. An assembly maybe be selected to have an interior volume including at least a first and second shelf portion extending separately into the interior of the volume from a sidewall of the volume so as to expose at least a first portion of sidewall between the first and second shelf portions. A cap may be positioned to extend to rest over top portions of the first and second shelf portion. A temporary adhesive dam may be applied below the cap such that the cap is raised slightly above the first and second shelf portion. An adhesive may be injected to adhere the cap to the first portion of the sidewall in an amount sufficient to also adhere the top portions of the first and second shelf portions to the cap. The adhesive may be cured and the temporary adhesive dam may be removed.

In further embodiments, the adhesive type may be a heat activated film or a liquid adhesive.

In further embodiments, the assembly may be cylindrical and the temporary adhesive dam may be a sticker.

BRIEF DESCRIPTION OF THE DRAWINGS

Reference will now be made to representative embodiments illustrated in the accompanying figures. It should be understood that the following descriptions are not intended to limit the embodiments to one preferred embodiment. To the contrary, it is intended to cover alternatives, modifications, and equivalents as may be included within the spirit and scope of the described embodiments as defined by the appended claims.

DETAILED DESCRIPTION

Various embodiments of an environmental seal that effectively prevents ingress of foreign matter while maximizing available space within a sealed interior volume of a component assembly for use within a portable electronic device are discussed herein. In certain embodiments, an interior volume of a component assembly may house at least a button and a sensor. A button cap may provide an engagement surface for a user to interact with the button, thereby providing an input to the electronic device. In certain embodiments, the button may also provide a tactile feedback effect from pushing or releasing the button. The button cap may extend from the interior volume, through an aperture, to the exterior surface of the component assembly. In certain designs, the sensor may be positioned directly below the button cap, but above the button itself.

In certain embodiments, the sensor may be a fingerprint sensor such that user authentication can be performed while the device is being operated by a user. The fingerprint sensor may utilize a grid of capacitive elements for capturing the fingerprint image or, in alternate embodiments, an optical sensor or other suitable fingerprint imaging technology. A control circuit can also be provided, for example, a button or switch element responsive to touch or pressure. In some designs, the fingerprint sensor can be utilized in combination with a button or display element formed with an anisotropic dielectric material such as sapphire.

In certain designs, the fingerprint sensor exhibits capacitive coupling with the ridges and valleys of the user's finger, such as at the epidermis of the user's finger, with the effect that the fingerprint sensor receives two-dimensional fingerprint image information, from which the electronic device can determine whether the fingerprint is the user's fingerprint or some other person's fingerprint. The fingerprint recognition sensor circuit might also or instead exhibit capacitive coupling with another portion of the user's finger, such as a subdermal layer thereof, or with another feature of the user's finger.

One may appreciate that foreign matter above, proximate, or below the sensor may interfere with capacitive coupling between the sensor and the ridges and valleys of the user's finger, which in turn may cause the two dimensional fingerprint information read by the sensor to be inaccurate, which in turn may cause the electronic device to incorrectly reject a user's fingerprint, or in other cases, incorrectly authenticate some other person's fingerprint as the user. In such a case, the interior volume of the component assembly may be sealed with an environmental seal to prevent ingress of foreign matter that may interfere with operation of both the button and the sensor.

In certain embodiments, the environmental seal may be disposed along the edges of the button cap, bonding it with the internal sidewalls of an aperture within the component assembly. In certain other embodiments, the environmental seal may be disposed upon a shelf within the aperture supporting the button cap along its perimeter. In further embodiments, the environmental seal may be disposed proximate edges of the sensor itself such that the sensor is bonded with at least a portion of the internal sidewalls of the aperture within the component assembly. In certain designs in which the sensor takes a rectangular shape, the environmental seal may be disposed along the four corners of the sensor.

In some embodiments the button cap and sensor may be of different shapes. For example the button cap may be circular and the sensor may be square. In further embodiments, a sensor of large area may provide adequately detailed information. In such an embodiment, the maximum area a square sensor may occupy below a circular button cap is equal to the area of the circle's inscribed square. In these embodiments, the component assembly may include only a partial perimeter shelf within the aperture such that gaps in the shelf permit the corners of the square sensor to fully extend to the edges of the button cap. In such an embodiment, an environmental seal may be composed of multiple portions. For instance, first portion of an environmental seal may be disposed along the partial perimeter, and a second portion of an environmental seal may be disposed along the edges of the button cap not supported by the partial perimeter. The first and second portions may collaborate to form a unitary environmental seal around the entire perimeter of the button cap.

In some embodiments, individual portions of a multi-portion environmental seal may be fabricated from separate materials. For example, a first portion of an environmental seal may comprise a heat activated film and a second portion may comprise a liquid adhesive. In other embodiments, individual portions may be fabricated from the same material.

In certain embodiments, individual portions of a multi-portion environmental seal may be disposed in separate processes. For example, one portion may be disposed in a first manufacturing process, and a second portion may be disposed during a subsequent manufacturing process. In certain embodiments, although multiple portions may be disposed at different times, they may be cured simultaneously by subjecting the entire uncured multi-portion environmental seal to appropriate curing conditions (e.g., heat or ultraviolet light). However, in certain embodiments, portions of an environmental seal may be cured at different times.

Figure 1:
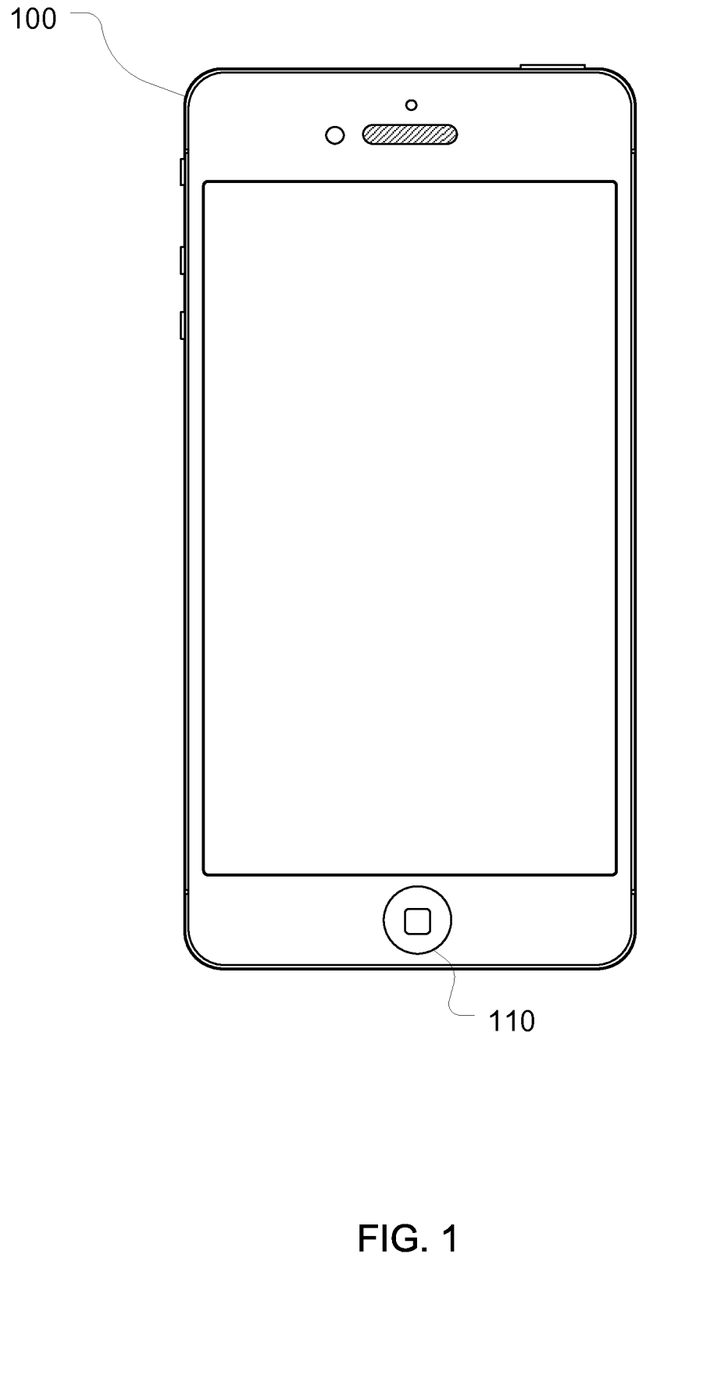
FIG. 1 is an isometric view of an example embodiment of a portable electronic device.

FIG. 1 is a front isometric view of an exemplary portable electronic device 100, incorporating an environmental seal (not shown). The electronic device 100 may include a button cap 110 which provides an engagement surface for a user to interact with an associated button (not shown).

Figure 2:
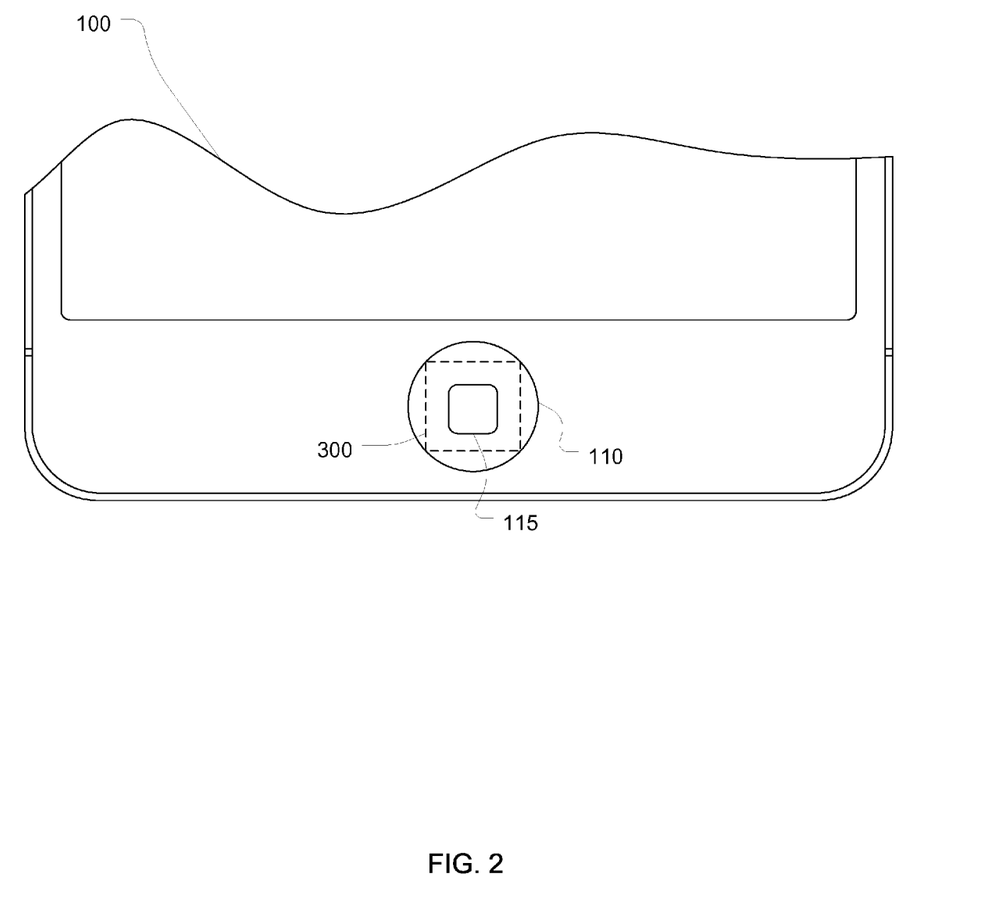
FIG. 2 is an enlarged detail top view of a button of the portable electronic device of FIG. 1.

FIG. 2 is an enlarged detail view of a circular button cap 110 of the portable electronic device 100 shown and partially described in reference to FIG. 1. Also shown is square sensor 300, illustrated below button cap 110. As shown, square sensor 300 occupies the maximum area possible while remaining bounded by the circumference of the circular button cap 110. In other words, the square sensor 300 is an inscribed square within circular button cap 110. In some embodiments, circular button cap 110 may be translucent, selectively translucent, or semi-translucent in order for sensor 300 to properly function. Sensor 300 may be an accelerometer, gyroscope, inertial measurement unit, global positioning sensor, proximity sensor, imaging sensor or any other sensor suitable for inclusion within electronic device 100. In certain embodiments, square sensor 300 may be a fingerprint imaging sensor.

The fingerprint imaging sensor 300 may also include an integrated circuit with one or more capacitive plates arranged in a two dimensional array. Each such capacitive plate may be disposed for collecting at least some fingerprint image information in response to the capacitive coupling with the ridges and valleys of the user's finger at one or more pixels in an array. This has the effect that, while each capacitive plate collects one or more pixels of fingerprint image information in an array, the set of those capacitive plates collectively receives a two dimensional array of fingerprint image information. For example, a two dimensional array of fingerprint image information can be used to determine substantial features of the user's fingerprint, which can be used to enroll the user's fingerprint in a database for later use, to compare at a later time against enrolled fingerprint image information to authenticate the user's fingerprint, and possibly to reject another person's fingerprint as not matching any enrolled user's fingerprint.

In the illustrated embodiment, the fingerprint sensor 300 may be disposed directly beneath button cap 110. In this way, fingerprint sensor 300 is positioned the smallest distance possible from the surface a user may engage with the user's finger. One may appreciate that the shorter the distance between fingerprint sensor 300 and the user's finger (not shown), the more tightly capacitively coupled a user's finger may be with the fingerprint sensor 300, which in turn may provide for more accurate fingerprint image information.

In certain embodiments, button cap 110 may act as a lens to focus, enhance, or direct input to fingerprint sensor 300. For example, the fingerprint recognition sensor circuit can take advantage of one or more electrical characteristics of the button cap 110, such as an anisotropy of the material (such as an aluminum oxide, sapphire, or another anisotropic material), to allow the fingerprint sensor circuit to better sense the epidermis of the user's finger (or optionally, a subdermal portion of the user's finger). This has the effect that the fingerprint sensor 300 circuit would exhibit relatively superior capacitive coupling to the user's finger by virtue of the anisotropy of the button material, with the effect that the fingerprint recognition sensor circuit would obtain a relatively superior set of fingerprint image information. Similarly, where applicable, the fingerprint sensor 300 can make use of other electromagnetic properties of the button cap 110 material to exhibit relatively superior capacitive coupling to the user's finger by virtue of those other electromagnetic properties of the button material.

In certain embodiments, the transparency of circular button cap 110 may be limited to a particular band of light. For example, circular button cap 110 may permit infrared light to pass through, while reflecting visible light. In such an embodiment, square sensor 300 may be an infrared proximity sensor. In certain other embodiments, an ink or pigment layer may be disposed upon the button cap, to give the button cap the appearance of having a particular color. The material for the ink layer may be chosen, as with the button cap itself, for its electromagnetic, dielectric, or optical properties. The ink layer may also serve to mask or otherwise obscure from view the fingerprint sensor 300 as well as other components beneath the button cap 110.

In certain embodiments, the ink layer may be disposed upon the button cap in a manner that includes decorative features 115. The decorative feature 115 may serve as a visual cue to the user of the function of the button. In certain embodiments, the decorative feature 115 may include a word, a recognizable symbol, or an image. The decorative features may be applied in a separate step prior to application of the ink layer or, in other embodiments, the decorative features may be applied in the same step. The decorative features 115 may be of a different color ink than the ink layer or the decorative features 115 may be formed by selective application of ink within the ink layer itself.

In other embodiments, square sensor 300 may be an imaging sensor. In such an embodiment, button cap 110 may be shaped so as to function as a lens to focus or distribute light over the area of square sensor 300. In other embodiments, button cap 110 may be shaped as a non-destructive filter, having as little effect on light passing through as possible. Accordingly, the material selected for circular button cap 110 may be chosen specifically for its dichroic properties. For example, in one embodiment the material for button cap 110 may be selected for particular anisotropic properties with respect to a particular electrical field, or with respect to particular wavelengths of light. For example, the button cap 110 may be a polarizing light filter. Suitable materials for circular button cap 110 may include plastic, glass, sapphire glass, and other similar materials. In such an embodiment, image artifacts resulting from obstruction by decorative features 115 of the button cap 110 may be accounted for by the electronic device.

In further embodiments, circular button cap 110 may be semi-flexible. For example, square sensor 300 may be a variable force input sensor which measures force a user applies to the circular button cap 110. In certain other embodiments, circular button cap 110 may be rigid in order to prevent varied force across square sensor 300.

One may appreciate that square sensor 300 may impact the quality, type, or properties of the material selected for button cap 110.

Figure 3:
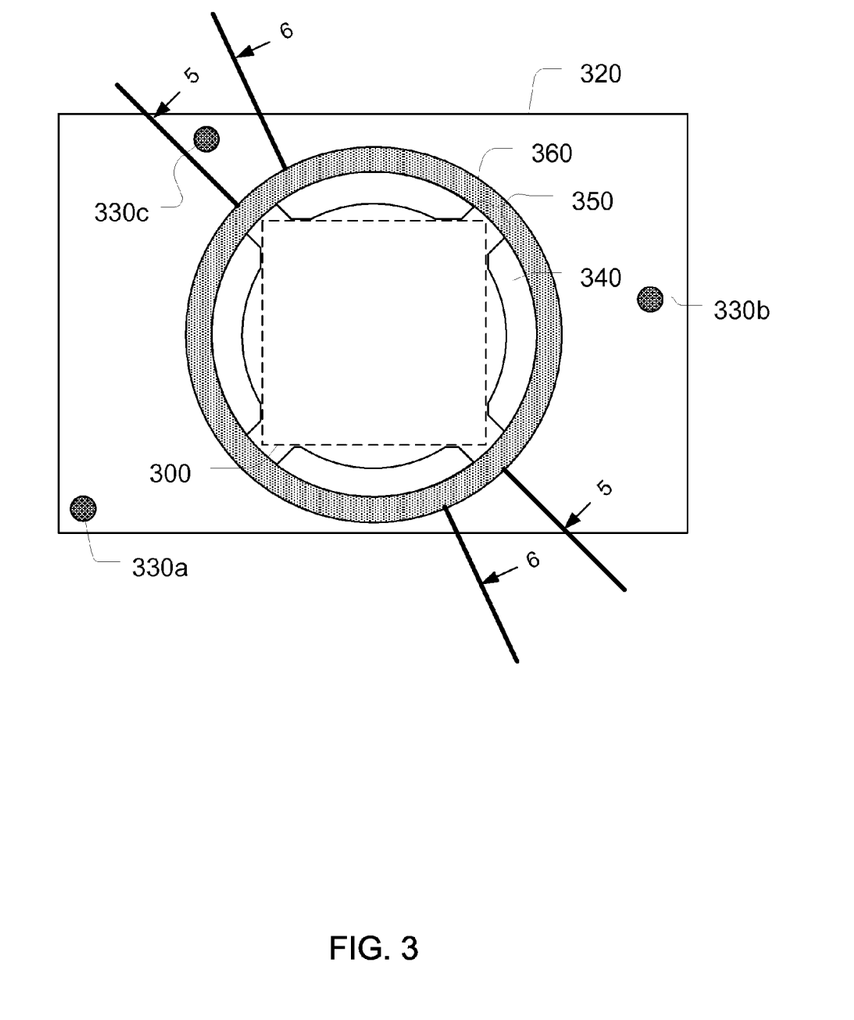
FIG. 3 is a top plan view of a portion of button assembly for receiving an environmental seal.

FIG. 3 is a top plan view of a button assembly for receiving an environmental seal. The button assembly may include a circular trim ring 360, a rectangular base portion 320, and fiducial markers 330a, 330b, and 330c. Also shown is the perimeter of square sensor 300. In one embodiment, the trim ring 360 can be used to shield electromagnetic effects (i.e. provide grounding), and thereby providing capacitance isolation or other electromagnetic isolation. The trim ring 360 is shown in the figure as having a cylindrical edge which holds the button cap 110 (see FIG. 2), and a base portion 320 which can be aligned or oriented within the device 100 (see FIG. 2) when the assembly is constructed. The positioning and number of fiducial markers 330a, 330b, and 330c may vary. Circular trim ring 360 may also include along its interior sidewall perimeter a partial perimeter shelf 340 which, as shown, is divided into four separate portions. The partial perimeter shelf 340 as illustrated extends into the interior of circular trim ring 360 a distance bounded by the diameter of a smaller concentric circle. One may appreciate however, that different shapes for both the trim ring 360 and partial perimeter shelf 340 may be used. For example, partial perimeter shelf 340 of may extend a greater distance from the interior perimeter of circular trim ring 360 to meet with the edges of a square sensor 300 inscribed within the interior perimeter of circular trim ring 360. In other words, the depth and shape of partial perimeter shelf 340 may differ from embodiment to embodiment. In further embodiments, trim ring 360 may be an elliptical shape. Correspondingly, the partial perimeter shelf 340 portions may have a different shape along the major axis of the elliptical trim ring 360 than the shape of the partial perimeter shelf 340 portions along the minor axis. Further, one may understand that the partial perimeter shelf may be separated into more or fewer portions than the four as illustrated.

Between individual portions of the partial perimeter shelf 340 are sidewall openings 350. These openings may be of any suitable shape or size so as to allow the corners of square sensor 300 reach the sidewall of the trim ring 360. In this way, square sensor 300 occupies the maximum area possible while remaining bounded by the circumference of the circular button cap 110 (see FIG. 2).

Figure 4A:
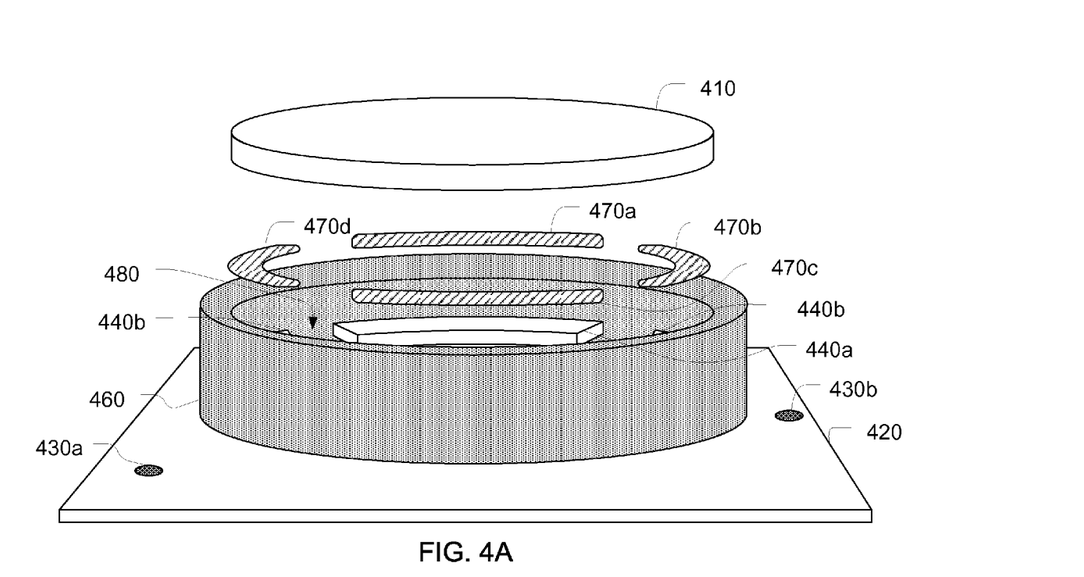
FIG. 4A is an isometric side view of an exploded button assembly showing a button cap and a first portion of the environmental seal of FIG. 3.

FIG. 4A is an isometric side view of an exploded button assembly 400 showing a button cap 410 and a first portion of the environmental seal 470a-d as shown in FIG. 3. FIG. 4A shows the button cap 410 and a first portion of an environmental seal composed of adhesive film components 470a-d. Also visible is one of four portions of the partial perimeter shelf 440, labeled as 440a, placed approximately halfway between a base portion 420 and the top of the trim ring 460. Also visible are additional portions of the partial perimeter shelf 440b and 440d. Between each portion of the partial perimeter shelf is a sidewall opening 450. Also visible are fiducial markers 430a, 430b. Fiducial markers 430a, 430b, and 430c (not visible) may be used during assembly as a point of reference or measure for automated assembly equipment to accurately and repeatedly locate portions of the button assembly 400.

Figure 4B:
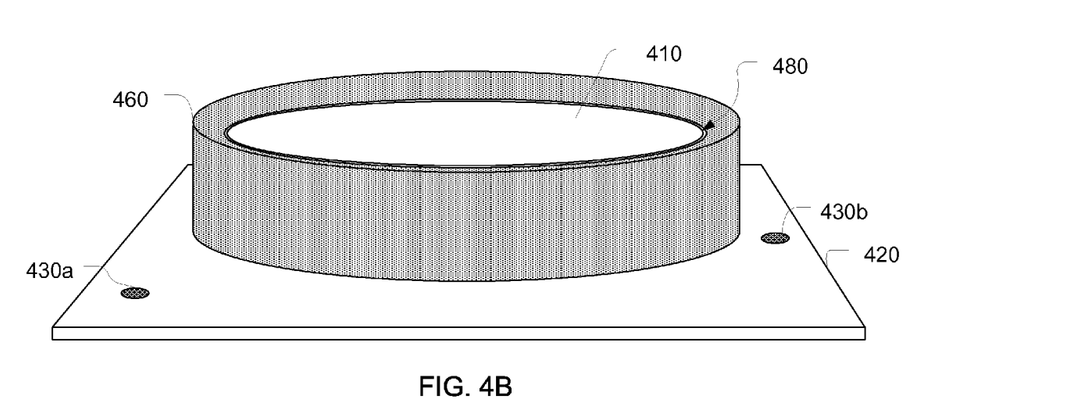
FIG. 4B is an isometric side view of the button assembly of FIG. 4A.

Each of the four portions of the partial perimeter shelf 440 corresponds to an adhesive film component 470a-d. For example, the partial perimeter shelf portion 440a corresponds to the film component 470a, the shelf portion 440b to the film portion 470b and so on. In a first process, the film portions may adhere to the corresponding shelf portions and to the underside of the button cap 410. Thereafter, the button cap 410 may be set within the trim ring 460 so that the button cap 410 rests along the partial perimeter shelf 440 and adheres to the perimeter shelf with the film components 470a-d. FIG. 4B illustrates the button cap 410 after it is placed along the partial perimeter shelf 440. In some embodiments, the button cap 410 may have a slightly smaller diameter than the interior diameter of the trim ring 460. In this case, as illustrated in FIG. 4B, a gap 480 may be present. The gap 480 may be used in a later process as a volume to accept an injected adhesive. One may appreciate that the gap 480 may be either larger or smaller than as shown in FIG. 4B.

Figure 5:
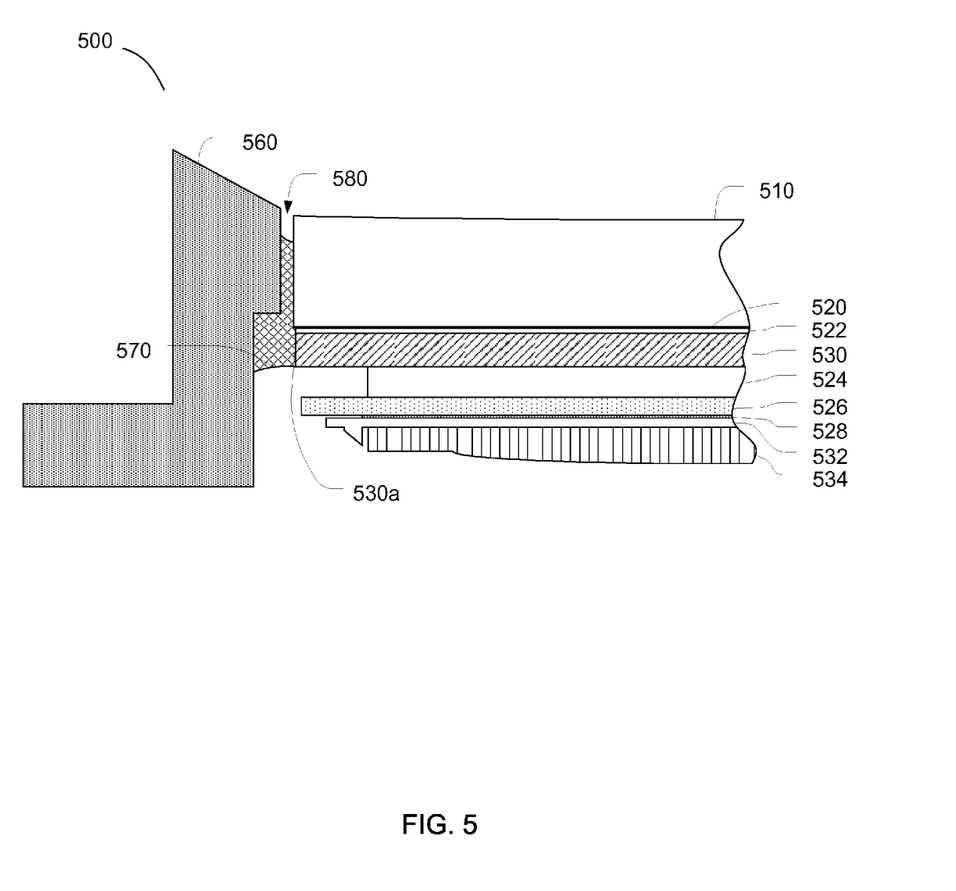
FIG. 5 is a fragmentary view of a schematic cross section of the laminated layers of a button and sensor assembly taken along line 5-5 of FIG. 3

FIG. 5 is a fragmentary view of a schematic cross section of the laminated layers of a button and sensor assembly taken along line 5-5 of FIG. 3. In this cross section, one of two diametrically opposing ends of the trim ring 560 is shown. Also shown is the circular button cap 510. Of note is that line 5-5 does not intersect any portion of the partial perimeter shelf. Instead, FIG. 5 shows a cross section through sidewall opening 350 (not shown in FIG. 5, see FIG. 3).

The button assembly 500 includes a slight recessed shape formed at least in part by a portion of the button cap 510 to guide the user's finger onto the button. The button cap 510 is disposed within the trim ring 560. Also shown in FIG. 5 is gap 580, which illustrates a separation between the circular button cap 510 and the interior perimeter of the trim portion 560.

In one embodiment, an ink assembly including multiple layers of ink 520, is disposed below the button cap 510. In one embodiment, the ink assembly can be printed on the button cap 510, vapor deposited thereon, or applied by another technique. This has the effect that the otherwise-translucent button cap 510 can be made opaque or partially opaque so the internal elements of the fingerprint sensor and button assembly are not immediately visible to the user. In this cross section, the button cap 510 may be coupled at its edges to the trim ring 560 using a perimeter sealant 570.

In some embodiments, the perimeter sealant 570 may be injected from either the top or the bottom portion of the button assembly 500 into the gap 580. The perimeter sealant 570 may, in certain embodiments, be injected as a liquid adhesive that may cure when subjected to appropriate curing conditions, such as heat or ultraviolet light. The perimeter sealant 570 may adhere to the edges of button cap 510 and may also adhere to the interior sidewall perimeter of trim portion 560, creating a seal when cured. In further embodiments relating to this cross section, the perimeter sealant 570 may also adhere a corner 530a of the fingerprint sensor 530 (described in further detail below) to the interior sidewall of the trim portion 560.

In certain embodiments, the perimeter sealant 570 may be injected as a single dot of liquid adhesive or, in other cases, it may be injected as a stream or jet of liquid adhesive. In certain further embodiments, the perimeter sealant 570 may be of sufficiently low viscosity such that it may expand to fill the gap 580 by capillary action. Although the perimeter sealant 570 is shown with concave meniscuses, it is understood that varied material choices for the perimeter sealant 570 may cause different meniscus shapes to form along the trim portion 560 and the button cap 510. It is further understood that various material choices for the button cap 510 and the trim portion 560 may have different adhesion characteristics with the perimeter sealant 570. One may appreciate, however, that the materials of the perimeter sealant 570, the trim portion 560, and the button cap 510 must be chosen such that the perimeter sealant 570 may effectively bond with both the trim portion 560 and the button cap 510.

The fingerprint sensor and button stack disposed below the button cap 510 may include a liquid lamination layer 522. In some embodiments, the liquid lamination layer 522 is disposed below the ink layer 520. The liquid lamination layer 522 may serve to couple or otherwise adhere the fingerprint sensor 530 to the button cap 510. The fingerprint sensor 530 may be coupled to a flexible element 524. The flexible element 524 may be further coupled or otherwise adhere to a stiffener element 526. The stiffener element 526 may be disposed above and coupled or otherwise adhere to a high-strength bonding tape, such as VHB (very high bond) tape 528, which may be in turn disposed above and coupled or otherwise adhere to a flexible element 532 and to the tactile switch (button switch) 534. The stiffener element 526 may provide rigidity to the button stack and may cooperate with the flexible element 524 to more uniformly distribute any force applied when a user depresses or otherwise engages the button cap 510.

One may appreciate that the assembly as described provides the fingerprint sensor with relatively short distance to the user's finger, and relatively short stacking height, while concurrently allowing the user to access a push button or other element of the device using the fingerprint recognition sensor.

Figure 6:
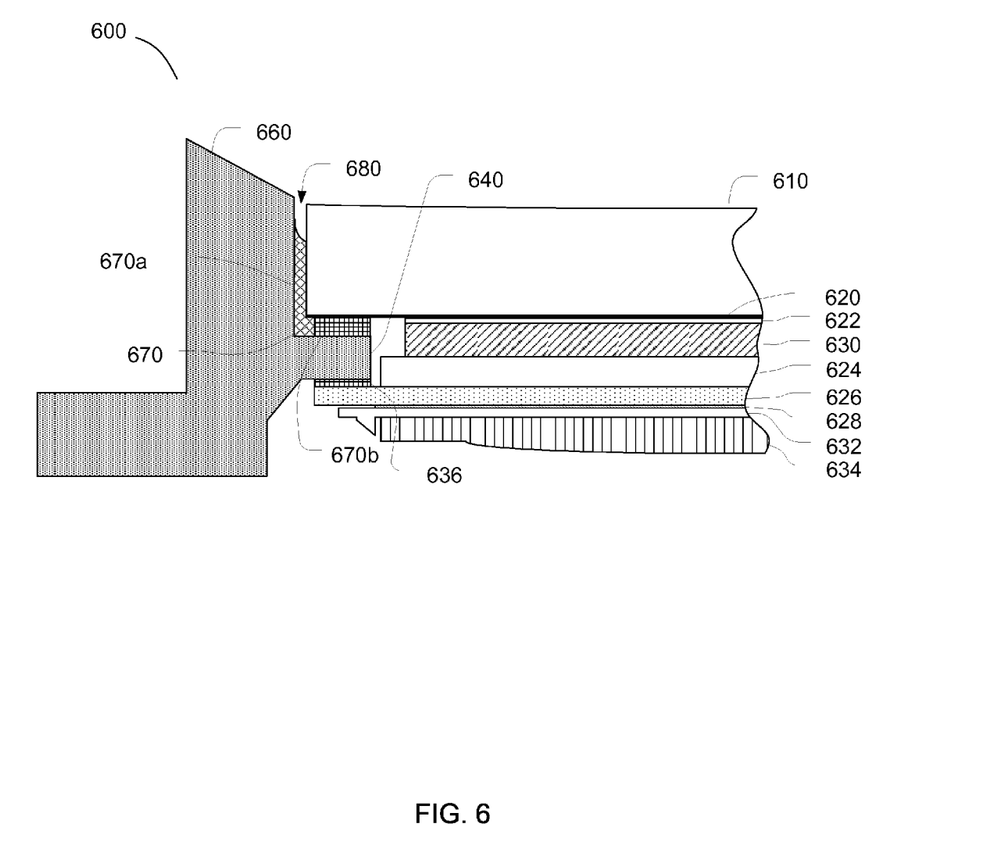
FIG. 6 is a fragmentary view of a schematic cross section of the laminated layers of a button and sensor assembly taken along line 6-6 of FIG. 3

FIG. 6 is a fragmentary view of a schematic cross section of the laminated layers of a button and sensor assembly taken along line 6-6 of FIG. 3. In this cross section, one of two diametrically opposing ends of the trim ring 660 is shown. Also shown is the circular button cap 610. Of note is that line 6-6 intersects a portion of the partial perimeter shelf 640, but does not intersect a sidewall opening 360 (not shown in FIG. 6, see FIG. 3) such as shown in FIG. 5.

The cross section of partial perimeter shelf 640, as shown in FIG. 6, extends a certain distance into the interior volume of the trim ring 660. The button cap 610 is coupled to the top surface of the partial perimeter 640 shelf through the adhesive film 670b. The adhesive film 670b may be of any suitable material that adheres to both the trim ring 660 and to the underside of the button cap 610. In certain embodiments, the adhesive film 670b may be cured with heat, pressure, or ultraviolet light, or any combination thereof. In further embodiments, the adhesive film 670b may be a liquid adhesive. Also in this cross section, the button cap 610 may be coupled at its edges to the trim ring 660 using a perimeter sealant 670a. In some embodiments, the perimeter sealant 670a may be injected from either the top or the bottom portion of the button assembly 600 into the gap 680. In further embodiments, the perimeter sealant 670a may fill the gap 680 by capillary action from an injection point at 580, as shown in FIG. 5. The perimeter sealant 670a may, in certain embodiments, be a liquid adhesive that may cure when subjected to appropriate curing conditions, such as heat or ultraviolet light. The perimeter sealant 670a may adhere to the edges of the adhesive film 670b and may also adhere to the interior sidewall perimeter of the trim portion 660, creating a contiguous environmental seal when cured. In certain embodiments, the perimeter sealant 670a may not necessarily adhere or otherwise chemically bond with the edges of the adhesive film 670b, but may instead extend by capillary action to meet and interface the edge of the adhesive film 670b.

In certain embodiments, such as that shown in FIG. 6, the adhesive film 670 may not extend along the entire width of the partial perimeter shelf 640, but may instead extend from the inner edge of the partial perimeter 640 shelf a distance toward the interior perimeter of the trim ring 660 that does not extend to the outer edge of the button cap 610. In this configuration, a small volume that is substantially L shaped in cross section remains, formed by the interior sidewall of the trim ring 660, the top portion of the partial perimeter shelf 640, the edge of the adhesive film 670b, and the outer perimeter of the button cap 610. The perimeter sealant 670a may fill this volume when applied.

In certain embodiments, the perimeter sealant 670a and the adhesive film 670b may bond to one another in a single curing process to form a single seal 670. In some embodiments, the seal 670 may have the two parts cured in separate processes from one another. For example the seal portion 670a (perimeter sealant as shown) may be cured first, and the seal portion 670b (adhesive film as shown) may be cured second. In alternate embodiments, the opposite curing order may be used. In further embodiments, both seal portions 670a, 670b may be cured in the same process. In certain embodiments, the seal portions 670a, 670b may cure under different conditions. For example, the adhesive file 670b may cure with pressure and heat applied whereas the perimeter sealant 670b may cure under a certain wavelength of ultraviolet light. One may appreciate that regardless the order or curing type, when the seal portions 670a, 670b are both cured, they may function as a single unitary seal.

As with FIG. 5, the button assembly 600 illustrated in FIG. 6 includes a recessed shape formed at least in part by a portion of the button cap 610 to guide the user's finger onto the button. The button cap 610 is disposed within the trim ring 660, forming a gap 680. The layers of ink 620 may be disposed below the button cap 610, above the fingerprint sensor 630. The fingerprint sensor 630 and the button stack disposed below the button cap 610 includes the liquid lamination layer 622 which, as in FIG. 5, couples or otherwise adheres the fingerprint sensor 630 to the button cap 610. The fingerprint sensor 630 is also coupled or otherwise adhered to a flexible element 624 which is further coupled or adhered to a stiffener element 626. The stiffener element is disposed above and coupled or otherwise adhered to a high-strength bonding tape 628, which is in turn disposed above and coupled or otherwise adhered to a flexible element 632 and to a tactile switch (button switch) 634. The stiffener element 626 may also be coupled or otherwise adhered to the bottom portion of the partial perimeter shelf 640 via the adhesive film 636. The stiffener element 626 may provide rigidity to the button stack and may cooperate with the flexible element 624 to more uniformly distribute any force applied when a user depresses or otherwise engages the button cap 610.

Both FIGS. 5 and 6 show cross section views of the button assembly as partially described in FIGS. 4A and 4B. Each cross section shows a component stack which generally includes a button cap atop a fingerprint sensor atop structural components atop a physical button. As shown, the component stack may be multiple layers. At the base of the component stack, an inverted dome switch, or other tactile switch is may be placed. In this manner, when the button cap is depressed by the user, the entire component stack may be compressed downward, exceeding a maximum force threshold for dome switch, causing the switch to activate.

Figure 7:
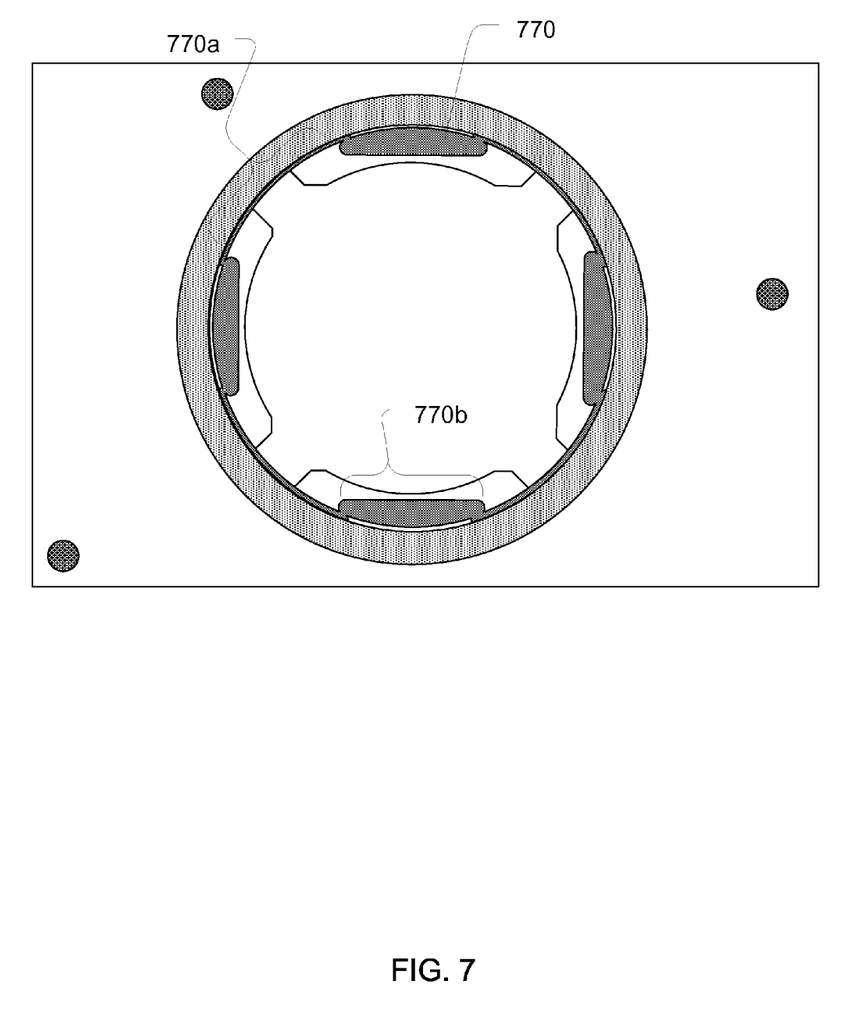
FIG. 7 is a top plan view of the button assembly of FIG. 4A showing a both a first portion and a second portion of an environmental seal.

FIG. 7 is a top plan view of the button assembly of FIG. 4A showing a top view of a cured environmental seal 770, which is formed from the combination of both a first seal portion 770a and a second seal portion 770b of the environmental seal 770. For illustrative purposes, internal components and the button cap are not shown.

Figure 8:
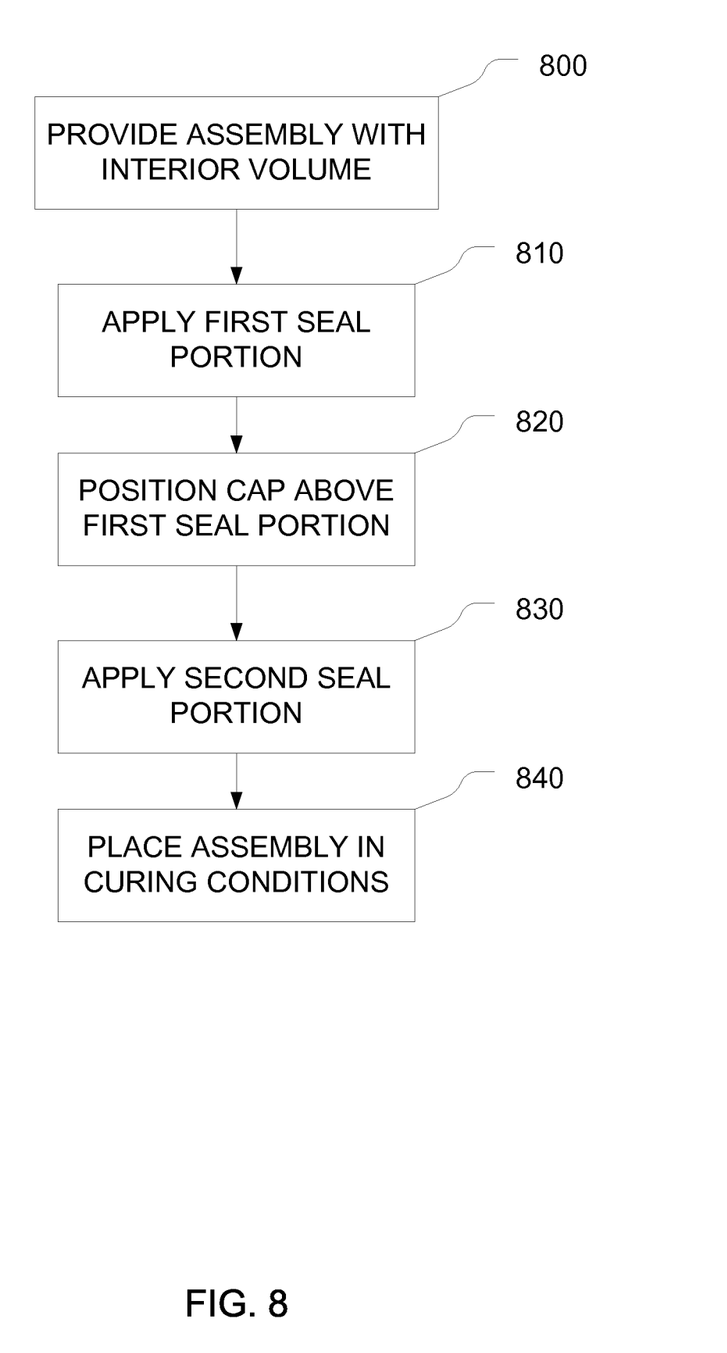
FIG. 8 is a flowchart illustrating an exemplary process of providing a two-part environmental seal.

FIG. 8 is a representative flowchart of an exemplary method of sealing a volume. First an assembly having an interior volume is selected in step 800. As described above, the interior volume may be a button assembly that has at least a first and second shelf portion extending separately into the interior of the volume from a sidewall. In other embodiments, more than two shelves may be present, as, for example, the embodiments disclosed above.

Next, a first adhesive of a first adhesive type may be applied to a top face of the first shelf portion at step 810. In certain embodiments, the first adhesive may be, as described above, a heat activated film. In the same step, a second adhesive strip of the same type as the first adhesive may be applied to the second shelf.

Next, the button cap may be positioned above the first and second seals as indicated in step 820. In certain embodiments, the cap is posited to extend and adhere to both the first adhesive and the second adhesive, or in other words, to rest on the shelf portions that extend into the interior of the volume of the assembly.

Next, a third adhesive of a second adhesive type may be applied to adhere the cap to the at least a first portion of exposed interior sidewall as indicated in step 830. In this case the second adhesive type may be a liquid adhesive that is of sufficiently low viscosity so that it is drawn by capillary action into areas adjacent to the injection point. For example, the third adhesive may be injected immediately above a portion of exposed interior sidewall or, in other words, injected adjacent to but not above a shelf portion. In such an embodiment, capillary action may draw the third adhesive to the area proximate the first and second shelves. In certain embodiments the third adhesive may interact with the first and second adhesives to form a singular bond and singular seal between the interior sidewall of the assembly and the button cap.

Next, the assembly may be placed in conditions appropriate for curing as indicated in step 840. For example, if the first adhesive type is a heat activated film and the second adhesive type is an ultraviolet curing liquid adhesive, the assembly may be placed in a curing oven that also emits ultraviolet light of appropriate wavelength for curing the liquid adhesive. In such an embodiment, the two types of adhesive are cured substantially simultaneously. In other embodiments, the adhesives may be cured in a multi-step process. For example, the assembly may be placed in a curing oven first and thereafter bathed in curing ultraviolet light. In further embodiments, the first adhesive may be cured before the second adhesive is applied. In still further embodiments, internal components may be placed beneath the button cap before either adhesive is applied or cured. For example, a sensor stack as described above may be adhered directly to a button cap. The sensor stack and button cap may then be inserted into the interior volume of the assembly, after which the two adhesive types may be applied and the assembly may be cured.

One may appreciate that although many embodiments are disclosed above, that the operations presented in FIG. 8 are meant as exemplary and accordingly are not exhaustive. One may further appreciate that alternate step order or additional or fewer steps may be used to accomplish the same method.

Figure 9:
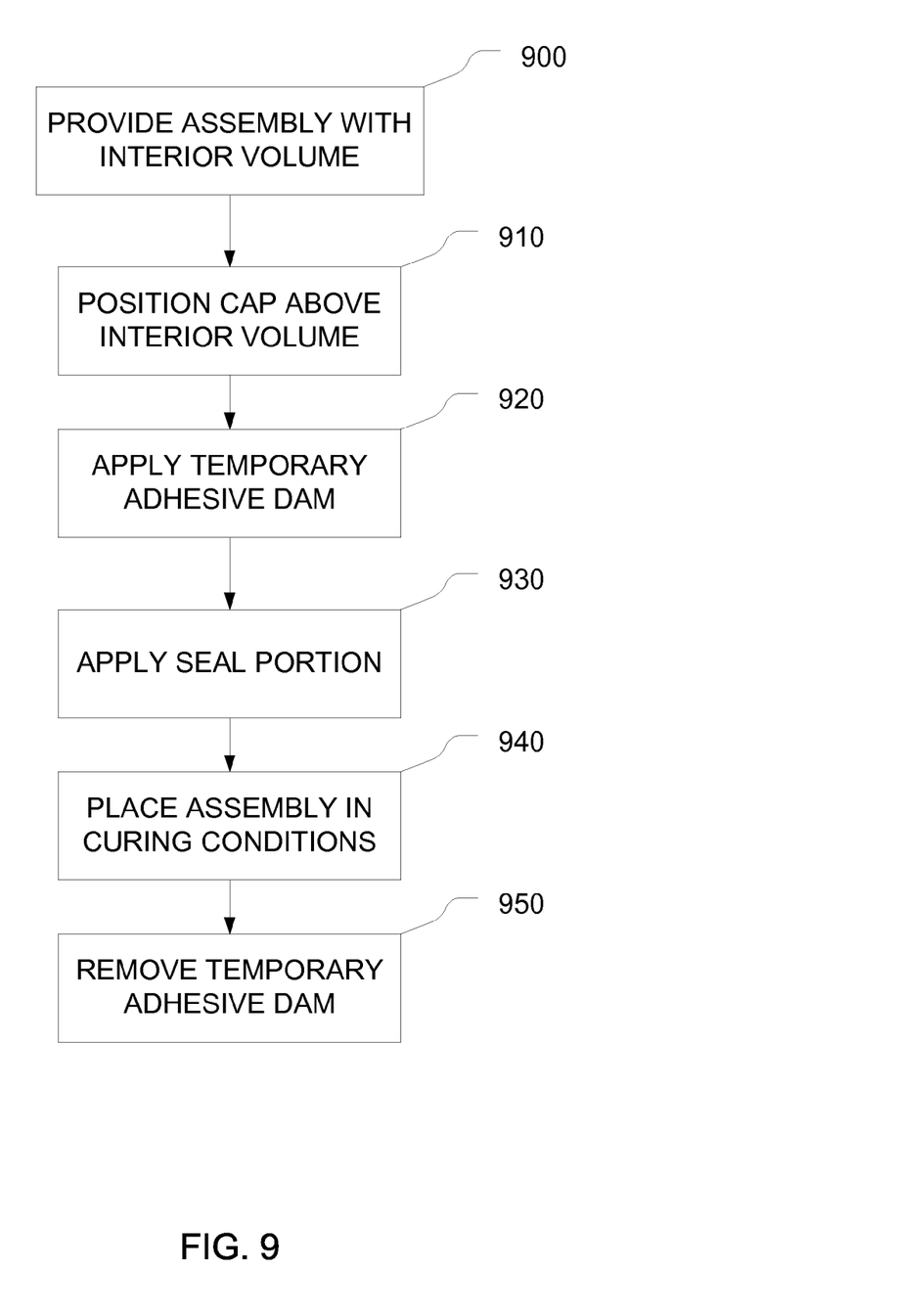
FIG. 9 is a flowchart illustrating another exemplary process of providing an environmental seal.

FIG. 9 is another representative flowchart of an exemplary method of sealing a volume. Similar to FIG. 8, in the first step 900 an assembly is selected having an interior volume that may include a button assembly which has at least a first and second shelf portion extending separately into the interior of the volume from an interior perimeter sidewall. In other embodiments, more than two shelves may be present.

Next, the button cap may be positioned resting above the first and second shelf portion in step 910.

Next, a temporary adhesive dam may be applied to overlap the first and second shelf portions and the button cap as indicated in step 920. In this way the temporary adhesive dam creates a temporary interior volume between the interior perimeter sidewall of the assembly and the edges of the button cap.

Next, a seal portion may be applied by injecting an adhesive to adhere the cap to the at least a first portion of exposed interior sidewall as provided in step 930. In this case the adhesive type may be a liquid adhesive that is of sufficiently low viscosity so that it is drawn by capillary action into areas adjacent to the injection point. For example, the adhesive may be injected immediately above a portion of exposed interior sidewall, or may be injected above a shelf portion. In such an embodiment, capillary action may draw the third adhesive to the area proximate the first and second shelves, and to areas proximate the exposed shelf portions. In certain embodiments the adhesive fill the entire volume created between the temporary adhesive dam, the underside of the button cap, the edge of the button cap, and the interior perimeter sidewall of the assembly.

Next, the assembly may be placed in conditions appropriate for curing as indicated in step 940. For example, if the adhesive type is an ultraviolet curing liquid adhesive, the assembly may be bathed in ultraviolet light of appropriate wavelength for curing. Finally, the temporary damn may be removed after curing is complete as provided in step 950.

The embodiments described herein related to an environmental seal that effectively prevents ingress of foreign matter while maximizing available space within a sealed interior volume of a component assembly for use within a portable electronic device. In certain embodiments, an interior volume of a component assembly may house at least a button and a fingerprint sensor. When a user engages an upper surface of the component assembly, the dual purpose of activating the button and reading the user's fingerprint is accomplished.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments but is instead defined by the claims herein presented.

We claim:

1. A sealed volume comprising:
a sidewall defining an interior volume;
a first shelf portion and a second shelf portion each extending into the interior of the volume;
a cap positioned to extend across the interior volume and above the first and second shelf portions;
a first adhesive of a first adhesive type disposed between a top face of the first shelf portion and the cap;
a second adhesive of the first adhesive type disposed between a to face of the second shelf portion and the cap; and
a third adhesive of a second adhesive type disposed between the sidewall and the cap to adhere the cap to the sidewall and to seal the interior volume; wherein
the first adhesive type is curable in a first process and the second adhesive type is curable in a second process.

2. The sealed volume of claim 1, wherein the first adhesive type comprises a heat activated film.

3. The sealed volume of claim 1, wherein the second adhesive type comprises liquid adhesive.

4. A button assembly, comprising:
a sidewall defining an interior volume;
a first shelf portion and a second shelf portion each extending into the interior volume from the sidewall so as to define a gap between the first and second shelf portions;
a cap positioned to extend across the assembly to interface with both the first and second shelf portions;
a first adhesive positioned between the cap and the first and second shelf portions;
a sensor positioned below the cap such that a first portion of the sensor extends to meet the exposed portion of the sidewall, and a second portion of the sensor extends into the gap between the first and second shelf portions;
a second adhesive disposed between the cap and the sidewall to form a seal between the cap and the sidewall, wherein the first adhesive is curable in a first process and the second adhesive is curable in a second process.

5. The button assembly of claim 4, wherein the assembly is circular.

6. The button assembly of claim 5, wherein the sensor is square.

7. The button assembly of claim 6, wherein the sensor extends such that each corner of the sensor meets an exposed portion of the sidewall of the assembly.

8. A method of sealing a volume, comprising:
providing an assembly having a sidewall that defines an interior volume, the assembly comprised of at least a first shelf portion and a second shelf portion each extending into the interior of the volume from the sidewall;
positioning a cap over both the first and second shelf portions;
disposing a first adhesive of a first adhesive type between the cap and the first shelf portion;
disposing a second adhesive of the first adhesive type between the cap and the second shelf portion; and
applying a third adhesive of a second adhesive type to adhere the cap to the sidewall, wherein the first adhesive type is curable in a first process and the second adhesive type is curable in a second process.

9. The method of claim 8, wherein the selected assembly is cylindrical.

10. The method of claim 8, wherein the first adhesive type comprises a heat activated film.

11. The method of claim 8, wherein the second adhesive type comprises liquid adhesive.

12. The method of claim 8, wherein the second adhesive is jet injected.

13. A sealed volume comprising:
a shelf portion extending into an interior of the volume from a sidewall of the volume;
a cap extending across the interior volume;
a first adhesive of a first adhesive type disposed between the shelf portion and the cap to adhere the cap to the shelf portion; and
a second adhesive of a second adhesive type applied to adhere the cap to the sidewall and to seal the volume, wherein the first adhesive is curable in a first process and the second adhesive is curable in a second process.

14. The sealed volume of claim 13, wherein the first adhesive type comprises a heat activated film.

15. The sealed volume of claim 13, wherein the second adhesive type comprises liquid adhesive.

* * * * *

UNITED STATES PATENT AND TRADEMARK OFFICE
CERTIFICATE OF CORRECTION

| | | |
|---|---|---|
| PATENT NO. | : 9,254,633 B2 | Page 1 of 1 |
| APPLICATION NO. | : 13/937776 | |
| DATED | : February 9, 2016 | |
| INVENTOR(S) | : Rao et al. | |

It is certified that error appears in the above-identified patent and that said Letters Patent is hereby corrected as shown below:

In the Claims

In column 12, at line 19, delete "to" and insert --top--.

Signed and Sealed this
Third Day of May, 2016

Michelle K. Lee
*Director of the United States Patent and Trademark Office*